(12) United States Patent
Tempel et al.

(10) Patent No.: US 9,419,619 B2
(45) Date of Patent: Aug. 16, 2016

(54) CHIP AND METHOD FOR IDENTIFYING A CHIP

(71) Applicant: Infineon Technologies AG, Neubiberg (DE)

(72) Inventors: Georg Tempel, Dresden (DE); Rolf-Peter Vollertsen, Grasbrunn (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/868,451

(22) Filed: Sep. 29, 2015

(65) Prior Publication Data

US 2016/0094229 A1 Mar. 31, 2016

(30) Foreign Application Priority Data

Sep. 30, 2014 (DE) .......................... 10 2014 114 197

(51) Int. Cl.
*G11C 11/00* (2006.01)
*H03K 19/177* (2006.01)
*H03K 19/003* (2006.01)
*G11C 13/00* (2006.01)

(52) U.S. Cl.
CPC ...... *H03K 19/17708* (2013.01); *G11C 13/0007* (2013.01); *H03K 19/00315* (2013.01); *H03K 19/17764* (2013.01); *G11C 2213/32* (2013.01)

(58) Field of Classification Search
CPC .................. H03K 19/00315; H03K 19/17708; H03K 19/17764
USPC ............................. 365/189.05, 189.08, 189.18
See application file for complete search history.

(56) References Cited

U.S. PATENT DOCUMENTS

| 4,287,575 | A | | 9/1981 | Eardley et al. | |
|---|---|---|---|---|---|
| 5,768,192 | A | * | 6/1998 | Eitan | G11C 11/5671 257/E29.309 |
| 6,145,748 | A | * | 11/2000 | Neifer | G06K 7/0021 235/451 |
| RE43,171 | E | * | 2/2012 | Chu | G06F 21/71 713/193 |
| 2008/0144377 | A1 | | 6/2008 | Watanabe et al. | |
| 2010/0177555 | A1 | * | 7/2010 | Shimakawa | G11C 13/0007 365/148 |
| 2011/0154166 | A1 | * | 6/2011 | Nagasaka | H03M 13/2707 714/799 |

OTHER PUBLICATIONS

Tonti: eFuse Design and Reliability, IBM Semiconductor Research and Development Corporation, Essex, USA.
2T CMOS antifuse bitcell, http://www.kilopass.com/technology/2t-bitcell/.
1T-Fuse™ Logic NVM IP Technology, http://www.sidense.com/technology/1t-bit-cell.html.
QR code, http://en.wikipedia.org/wiki/QR_code.

(Continued)

*Primary Examiner* — Jason M Crawford
*Assistant Examiner* — Kurtis R Bahr

(57) ABSTRACT

A chip includes a logic circuit which has a plurality of transistors and is configured to carry out a logical data processing function, the transistors being operated in a first direction when carrying out the data processing function, and a readout circuit which is configured to control the logic circuit in such a manner that the transistors are operated in a second direction opposite the first direction and is configured to determine an identification of the logic circuit on the basis of an output from the logic circuit when operating the transistors in the second direction.

15 Claims, 4 Drawing Sheets

(56) References Cited

OTHER PUBLICATIONS

Schrijen: Basics and Advances in Hardware Intrinsic Security, Jun. 25, 2012.

Platonov: SRAM-Based Physical Unclonable Function on an Atmel ATmega Microcontroller, Master's Thesis, Czech Technical University, Faculty of Information Technology, Department of Computer Systems, Prague, May 1, 2013.

* cited by examiner

CHIP AND METHOD FOR IDENTIFYING A CHIP

CROSS-REFERENCE TO RELATED APPLICATION

This application claims priority to German Patent Application Ser. No. 10 2014 114 197.0, which was filed Sep. 30, 2014, and is incorporated herein by reference in its entirety.

TECHNICAL FIELD

Various embodiments relate generally to chips and methods for identifying a chip.

BACKGROUND

It is usually necessary for chip manufacturers to be able to track chips manufactured by them. Whereas this is typically easily possible in the case of memory modules since there is a memory for storing an identification, mechanisms which enable tracking and can be implemented with a small amount of effort (for example with a low chip area requirement and circuit complexity) are desirable for logic modules.

SUMMARY

A chip includes a logic circuit which has a plurality of transistors and is configured to carry out a logical data processing function, the transistors being operated in a first direction when carrying out the data processing function, and a readout circuit which is configured to control the logic circuit in such a manner that the transistors are operated in a second direction opposite the first direction and is configured to determine an identification of the logic circuit on the basis of an output from the logic circuit when operating the transistors in the second direction.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

Figure 1:
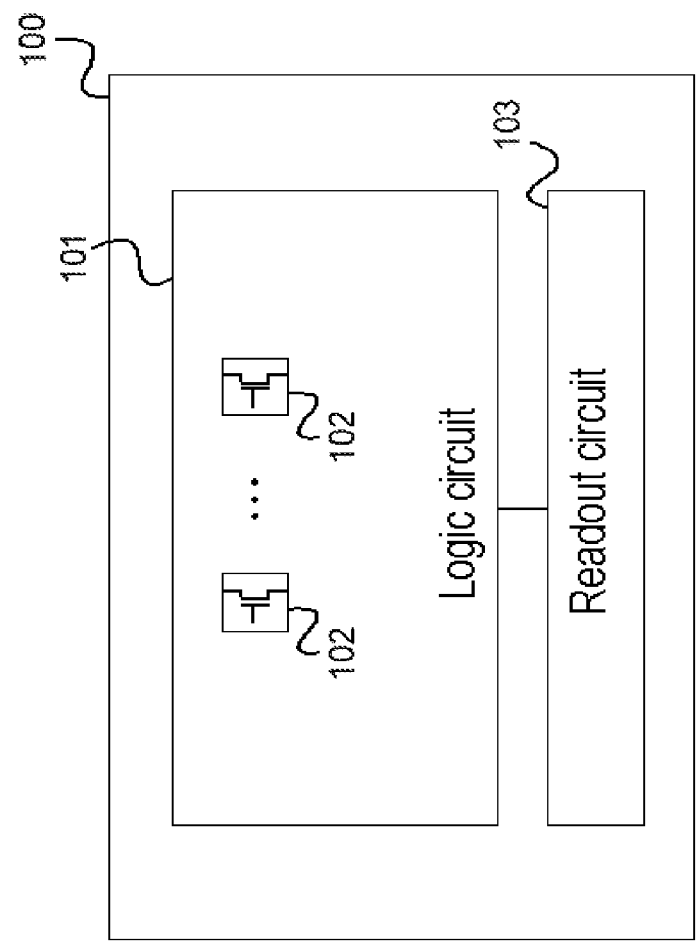
FIG. 1 shows a chip according to an embodiment.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The following detailed description relates to the accompanying figures which show details and embodiments. These embodiments are described in such detail that a person skilled in the art can carry out the invention. Other embodiments are also possible and the embodiments can be changed in a structural, logical and electrical respect without departing from the subject matter of the invention. The various embodiments do not necessarily exclude one another, but rather various embodiments can be combined with one another, with the result that new embodiments are produced. Within the scope of this description, the terms "linked", "connected" and "coupled" are used to describe both a direct and an indirect link, a direct or indirect connection and direct or indirect coupling.

Many SIP (System in Package) products use a pure CMOS logic module in addition to an NVM (Non-Volatile Memory) module in the same package. Whereas the NVM module receives a chip ID (identification) (which is programmed into memory areas provided for this purpose during its testing, for example) on the basis of its properties, this is not possible with pure CMOS (Complementary Metal Oxide Semiconductor) logic modules. However, since it is typically necessary for a manufacturer to be able to track the modules manufactured by it, this is not readily possible with a logic module since its relationship to its manufacture (for example date and location) is typically lost when assembling the SIP product in which it is used. For example, modules for SIP products may come from various sources (for example from different factories) or a module may even already be preassembled on a leadframe of the SIP product.

CMOS logic modules can be tracked logistically by carrying a chip ID (Identification) on a separate data storage medium or in a database until SIP assembly, for example. During SIP assembly, the chip ID of the CMOS module can be programmed into the NVM module. Another possibility is to maintain a chip-specific pattern ("fingerprint") for each CMOS module in a database. The CMOS module is therefore subsequently identified. Methods of this type are typically based on so-called PUFs (Physical Unclonable Function), for example an SRAM (Static Random Access Memory) fingerprint.

Alternatively, CMOS logic modules (typically without an overhead with respect to a CMOS logic process) can be provided with an identification by the following approaches:

a) When fusible links (fuses, for example polyfuses or metal fuses) are used, resistive connections are fused by high currents.

b) In the case of antifuse concepts, an originally high-value resistance is converted into a low-value resistance by means of accordingly high voltages. For example, a gate oxide can be brought to breakdown.

c) When programmable elements are used, NVM programming modes are implemented in a single poly process, such as each CMOS process, a poly gate with which contact has not been made being used as a floating gate.

However, all of these approaches use special designs and therefore also can be uniquely identified. Furthermore, the necessary additional area requirement is typically not negligible.

An approach which can be implemented without changing the design and with little additional area requirement is described below.

FIG. 1 shows a chip 100 according to an embodiment.

The chip 100 has a logic circuit 101 which has a plurality of transistors 102 and is set up to carry out a logical data processing function, the transistors being operated in a first direction when carrying out the data processing function.

The chip 100 also has a readout circuit 103 which is configured to control the logic circuit in such a manner that the transistors are operated in a second direction opposite the first direction and is set up to determine an identification of the logic circuit on the basis of an output from the logic circuit when operating the transistors in the second direction.

In other words, according to various embodiments, changes in the behavior of transistors in the reverse mode are used to identify a chip. For example, an identification is programmed in a chip by changing the threshold voltage of particular transistors in the reverse direction, whereas the threshold voltage in the forward direction remains unchanged, for example, or is changed only slightly such that the logical function of the chip is not impaired.

For example, CMOS transistors can be programmed by means of HCI (Hot Carrier Injection) such as CHE (Channel Hot Electron) injection. In this case, these charges are injected into the side wall oxide and/or the spacer of a CMOS transistor using appropriate voltage conditions and a sufficiently long stress time (programming time). Charges are therefore trapped there and in turn deplete the LDD (lightly doped drain) junction region, thus reducing the current in the transistor while the voltage conditions remain the same. A current reduction is equivalent to a shift in the threshold voltage and this effect is greater in the reverse direction than in the forward direction, as shown below.

For example, a pattern is actively programmed into a CMOS chip, only the typical transistors of the CMOS process being used, that is to say the transistors which are provided for a logical function of the CMOS chip (or CMOS module). This can be carried out during a wafer test, for example. The chip can therefore be uniquely identified from this time on. In various embodiments, it is not necessary to maintain a shadow database for identifying the chip.

The transistors are programmed, for example, in such a manner that the logical data processing function of the logic circuit is not impaired (that is to say, for example, still provides correct results, for example under nominal operating conditions). The logical data processing function is, for example, processing of binary input data to form binary output data, for example a calculation (for example of a plurality of possible calculations) such as an addition or more complex processing, for example encryption.

The first direction is, for example, a forward direction and the second direction is, for example, a reverse direction.

The transistors have at least one programmed transistor, for example.

According to one embodiment, the transistors have at least one transistor which is programmed in the first direction by charge carrier injection.

The readout circuit is configured, for example, to determine the identification on the basis of which of the transistors are programmed.

For example, the readout circuit is configured to determine whether a transistor is programmed on the basis of the current flowing through the transistor in the reverse direction.

According to one embodiment, the readout circuit is configured to determine for each transistor of the transistors whether it is programmed and, on the basis thereof, to set the value of a point in the identification, which is assigned to the transistor, in binary representation to "0" or "1".

The transistors are field effect transistors, for example.

According to one embodiment, the readout circuit is configured to operate at least one of the transistors in the reverse direction in such a manner that the potential difference between the source and the drain has a sign opposite that of the potential difference between the source and the drain during operation of the transistor when carrying out the data processing function.

The readout circuit may be configured to operate the transistors in the second direction with a potential difference between the source and the drain of a lower magnitude than when the transistors are operated in the first direction when carrying out the data processing function.

The transistors may be MOS transistors, for example.

The chip is a CMOS logic chip, for example.

Figure 2:
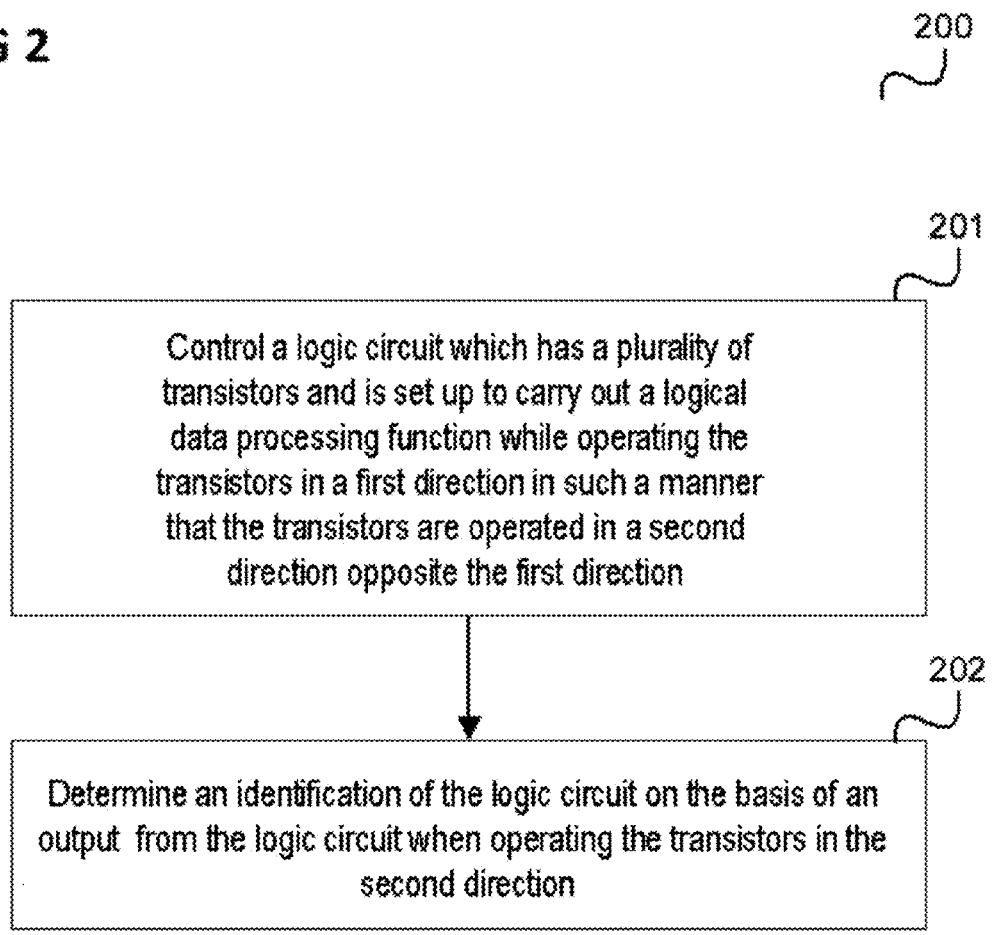
FIG. 2 shows a flowchart illustrating a method for identifying a chip.

According to one embodiment, a method is carried out, as illustrated in FIG. 2.

FIG. 2 shows a flowchart 200 illustrating a method for identifying a chip.

In 201, a logic circuit which has a plurality of transistors and is configured to carry out a logical data processing function while operating the transistors in a first direction is controlled in such a manner that the transistors are operated in a second direction opposite the first direction.

In 202, an identification of the logic circuit is determined on the basis of an output from the logic circuit when operating the transistors in the second direction.

The method also includes, for example, programming at least one of the transistors, for example programming at least one of the transistors by charge carrier injection.

It should be borne in mind that embodiments described in connection with the chip 100 analogously apply to the method illustrated in FIG. 2 and vice versa.

According to various embodiments, CMOS transistors are programmed by hot carrier injection (CHE), for example in a similar manner to the programming of NVM memory cells, as can be used for NROMs for the non-volatile storage of data. In this case, the intensifying influence can be used if the memory cells are read in the direction opposite the stress direction (that is to say the programming direction) (reverse read). An NROM may have an additional charge-storing layer (e.g. a nitride layer) and an erase mode may also be provided. Both are dispensed with according to one embodiment for identifying logic chips.

Figure 3:
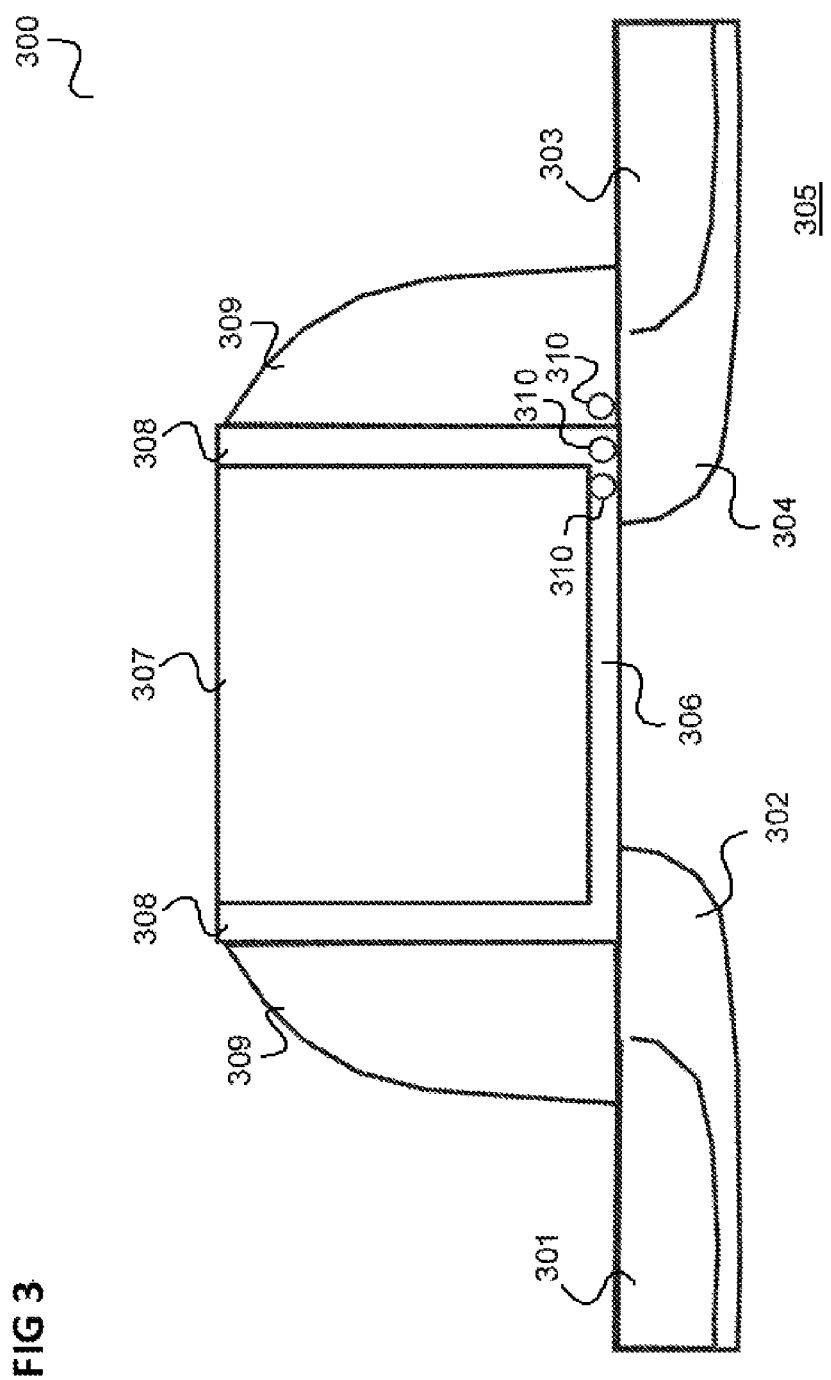
FIG. 3 shows a transistor according to an embodiment.

FIG. 3 shows a transistor 300 according to an embodiment.

In this example, the transistor 300 is a MOSFET (Metal Oxide Semiconductor Field Effect Transistor) and corresponds to one of the transistors 102, for example.

The transistor 300 has a source region with a highly doped (for example n⁺-doped) source subregion 301 and a lightly doped (for example n⁻-doped) source subregion 302.

The transistor 300 also has a drain region with a highly doped (for example n⁺-doped) drain subregion 303 and a lightly doped (for example n⁻-doped) drain region 304 (also referred to as LDD for "lightly doped drain").

The source region 301, 302 and the drain region 303, 304 are arranged in a substrate 305 (for example a p-type substrate). A gate oxide 306 is situated above the channel region between the source region 301, 302 and the drain region 303, 304 and a gate 307 is in turn situated above the gate oxide. The gate 307 is laterally bounded by side regions 308 of the gate oxide. The thickness of the side regions is typically different from the thickness of the gate oxide 306 since the side regions are formed using a different process step.

Spacers 309 which are formed from an oxide, a nitride or both, for example, are situated beside the side regions 308.

The transistor is assigned, for example, to a point in an identification of a chip, which contains the transistor, in a binary representation of the identification.

According to one embodiment, the transistor is programmed (for example in order to represent a binary "1" at that point in the identification which is assigned to it) by applying a programming voltage $V_d$ to it in a forward direction, which voltage causes electrons 310 to be trapped in the gate oxide 306, in the side region 308 on the drain side and/or in the spacer 309 on the drain side. These electrons change the threshold voltage of the transistor, with the result that the stored value can then be read out in the forward direction or reverse direction since, on account of its changed threshold voltage, the transistor exhibits a different behavior than if it had not been programmed. The operating modes for programming and reading are summarized in table 1.

TABLE 1

| Mode | Source voltage | Drain voltage | Direction |
|---|---|---|---|
| Programming | 0 V | $V_d$ | Forward |
| Reading | $V_{Lesen}$ | 0 V | Reverse |
| Reading | 0 V | $V_{Lesen}$ | Forward |

According to one embodiment, the bit of the chip identification is read out by reverse reading, whereas it is used to carry out a logical data processing function in the forward direction (that is to say the source has a higher potential than the drain). In this case, according to various embodiments, the difference in the threshold voltage shift, which is produced during programming, between the forward mode and the reverse mode is used, as illustrated in FIG. 4.

Figure 4:
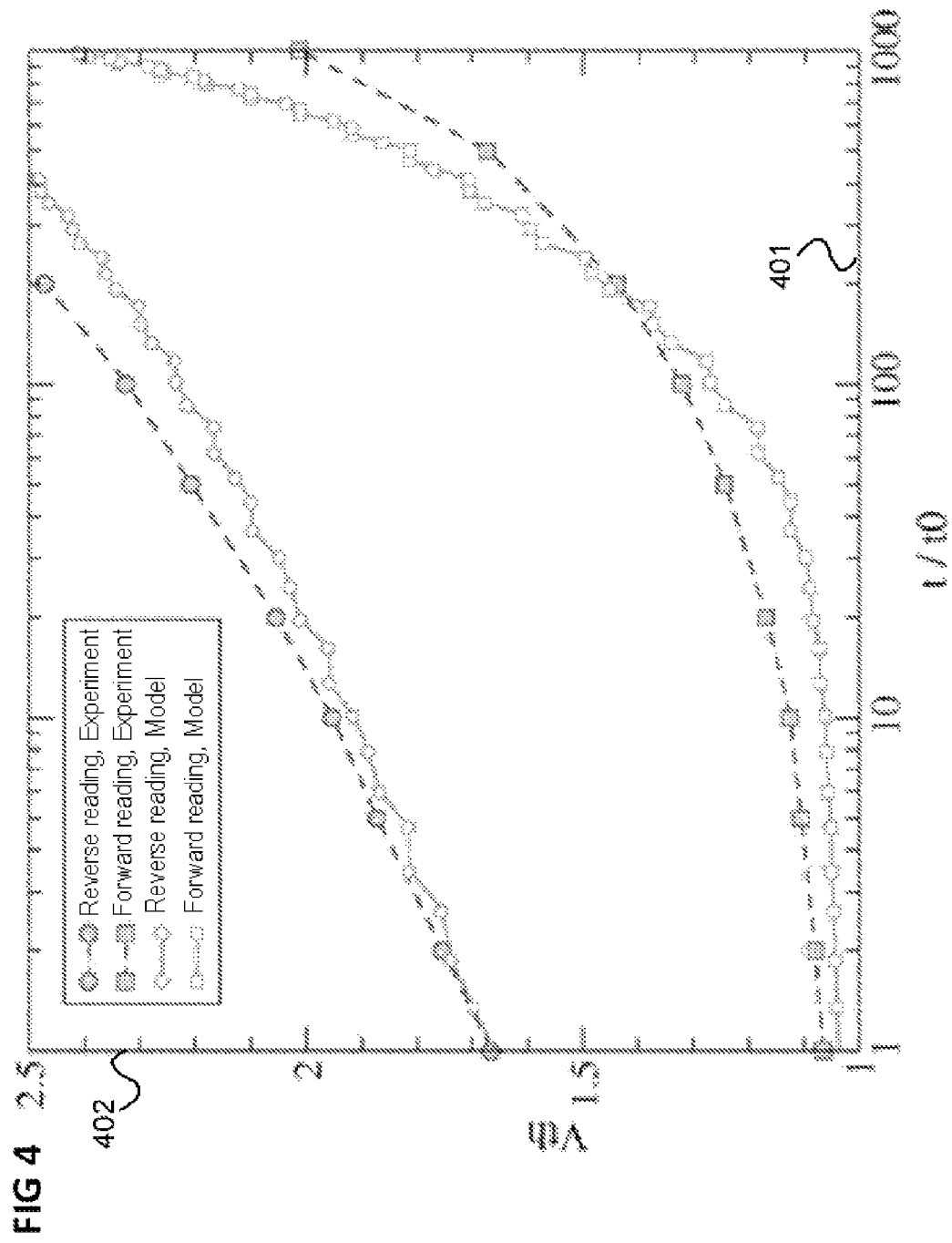
FIG. 4 shows the threshold voltage shift (according to an experiment and a model) as a function of the programming time.

FIG. 4 shows the threshold voltage shift (according to an experiment and a model) as a function of the programming time.

The programming time increases from left to right along the horizontal axis 401 and the threshold voltage increases from bottom to top along the vertical axis 402 (indicated relative to the original threshold voltage).

It can be seen that the change in the threshold voltage in the reverse mode (delta IDRS or DIDRS) is considerably higher than in the forward mode (delta IDFS or DIDFS). A behavior of the transistor in the forward mode (virtually) like that of an unprogrammed transistor can therefore be achieved with limited stress time. This lever (threshold voltage shift difference between the forward mode and the reverse mode) is still dependent on the doping of the LDD junction, that is to say the lightly doped drain region, since the lower the doping, the more easily the region can be depleted by the trapped charges, and dependent on the voltage across the transistor: a higher forward voltage at the drain reduces the observed threshold voltage drift in the forward direction. Conversely, a lower voltage $V_{Lesen}$ in the reverse direction increases the threshold voltage shift.

Table 2 shows the current change (forward and reverse) in percent in comparison with the original state at the time t0 after a stress time of 0.1 s and 10 s for four identical transistors. The column furthest to the right indicates the lever between the reverse mode and the forward mode on the current scale. The experiments are based on a 40 nm logic production process.

TABLE 2

| nMOS DG | | | | |
|---|---|---|---|---|
| CHE Stress: | Vd = 5.2, Vg = 2.0, tstress = 0.1 s | | | |
| Reading: | Forward | Reverse | | |
| Current change relative to t0: | DIDFS_NDH1 | DIDRS_NDH1 | | Forward/reverse current difference |
| Transistor1 | −0.8814251 | −3.561413 | --> | 2.6799879 |
| Transistor2 | −0.8480104 | −3.491974 | --> | 2.6439636 |
| Transistor3 | −0.8368201 | −3.419524 | --> | 2.5827039 |
| Transistor4 | −0.8627811 | −3.329942 | --> | 2.4671609 |
| CHE Stress: | Vd = 5.2, Vg = 2.0, tstress = 10 s | | | |
| Reading: | Forward | Reverse | | |
| Current change relative to t0: | DIDFS_NDH2 | DIDRS_NDH2 | | Forward/reverse current difference |
| Transistor1 | −1.781407 | −9.282109 | --> | 7.500702 |
| Transistor2 | −1.696021 | −8.927063 | --> | 7.231042 |
| Transistor3 | −1.692236 | −9.134345 | --> | 7.442109 |
| Transistor4 | −1.707205 | −8.731847 | --> | 7.024642 |

The following can be discerned:

a) It is possible to cause a measurable current change. Modern transistors can easily drive currents of 100 µA. It is therefore possible to cause several µA current changes. Since modern sense amplifier designs can already resolve 100 nA, such a difference can be detected.

b) The current change is a function of the stress time, as can be expected.

c) Stress times of 0.1 s may already be sufficient for a product according to a).

d) The current change is a function of the transistor type (not shown in table 2).

Table 3 shows results of an experiment with regard to the question of whether the current change as a result of the programming can also be detected after temperature storage of the transistor, which ultimately determines whether the transistor can reliably retain stored bits (data retention). The table indicates the values of the current change in percent with respect to the original state with and without heating (baking).

TABLE 3

|  | Forward Delta IDFS | Reverse Delta IDRS |
|---|---|---|
| without heating | −1.48 | −6.89 |
|  | −1.73 | −6.24 |
|  | −1.26 | −6.40 |
|  | −2.07 | −6.37 |
| with heating 250° C. 23.5 h | 0.05 | −1.59 |
|  | 0.23 | −1.28 |
|  | −0.20 | −1.26 |
|  | 0.00 | −1.48 |

It can be discerned that a noticeable difference between the reverse mode and the forward mode can still be observed even after a heating process.

According to various embodiments, the threshold voltage shift in the reverse mode and/or the difference in the threshold voltage shift between the forward mode and the reverse mode is/are increased as follows (possibly without additional process steps):

1) Selection of CMOS transistors with a high CHE sensitivity (since not all components of a technology behave in an equivalent manner).

2) Omission of the LDD implantation at the transistors by a corresponding lithography mask. In this case, use is made of the property whereby lower LDD doping levels result in a considerably higher CHE sensitivity. A further option is, for example, the partial compensation for LDD doping by opposite implantation (for example pLDD implantation in addition to nLDD implantation), for example by a corresponding lithography mask.

3) Use of nitride spacers to improve the trapping of charges and, for example, the retention of the charges.

4) Different biasing at the transistors, for example use of different (magnitudes of) potential differences between the reverse mode and the forward mode (for example by at least 10%, 20%, 30%, 40% or more, for example 2.5 V in the forward mode and 1.7 V in the reverse mode).

Depending on which of a multiplicity of transistors in a logic chip are programmed in the manner described above, the chip can be provided with a particular chip identification (by assigning a binary "1" to a transistor when it is programmed or a binary "0" when it is not programmed or vice versa, for example). In the reverse mode, the current which flows through one of the transistors given a particular voltage can be used to determine whether the transistor is programmed, and the chip identification can therefore be read out by determining whether or not each of the multiplicity of transistors is programmed. Clearly, a fingerprint of the chip can be actively manipulated by the programming and a PUF pattern of the chip can be generated, for example.

One embodiment provides a chip having a logic circuit which has a plurality of transistors and is configured to carry out a logical data processing function, the transistors being operated in a first direction when carrying out the data processing function, and a readout circuit which is configured to control the logic circuit in such a manner that the transistors are operated in a second direction opposite the first direction and is configured to determine an identification of the logic circuit on the basis of an output from the logic circuit when operating the transistors in the second direction.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A chip, comprising:
 a logic circuit which has a plurality of transistors and is configured to carry out a logical data processing function, the transistors being operated in a first direction when carrying out the data processing function;
 a readout circuit which is configured to control the logic circuit in such a manner that the transistors are operated in a second direction opposite the first direction and is configured to determine an identification of the logic circuit on the basis of an output from the logic circuit when operating the transistors in the second direction.

2. The chip of claim 1,
 wherein the first direction is a forward direction and the second direction is a reverse direction.

3. The chip of claim 1,
 wherein the transistors comprise at least one programmed transistor.

4. The chip of claim 3,
 wherein the readout circuit is configured to determine the identification on the basis of which of the transistors are programmed.

5. The chip of claim 4,
 wherein the readout circuit is configured to determine whether a transistor is programmed on the basis of the current flowing through the transistor in the reverse direction.

6. The chip of claim 3,
 wherein the readout circuit is configured to determine for each transistor of the transistors whether it is programmed and, on the basis thereof, to set the value of a point in the identification, which is assigned to the transistor, in binary representation to 0 or 1.

7. The chip of claim 1,
 wherein the transistors comprise at least one transistor which is programmed in the first direction by charge carrier injection.

8. The chip of claim 1,
 wherein the transistors are field effect transistors.

9. The chip of claim 1,
 wherein the readout circuit is configured to operate at least one of the transistors in the reverse direction in such a manner that the potential difference between the source and the drain has a sign opposite that of the potential difference between the source and the drain during operation of the transistor when carrying out the data processing function.

10. The chip of claim 1,
wherein the readout circuit is configured to operate the transistors in the second direction with a potential difference between the source and the drain of a lower magnitude than when the transistors are operated in the first direction when carrying out the data processing function.

11. The chip of claim 1,
wherein the transistors are MOS transistors.

12. The chip of claim 1,
wherein the chip is a CMOS logic chip.

13. A method for identifying a chip, the method comprising:
controlling a logic circuit which has a plurality of transistors and is configured to carry out a logical data processing function while operating the transistors in a first direction in such a manner that the transistors are operated in a second direction opposite the first direction; and
determining an identification of the logic circuit on the basis of an output from the logic circuit when operating the transistors in the second direction.

14. The method of claim 13, further comprising:
programming at least one of the transistors.

15. The method of claim 13, further comprising:
programming at least one of the transistors by charge carrier injection.

* * * * *